(12) United States Patent  
Buhay et al.

(10) Patent No.: US 6,962,759 B2  
(45) Date of Patent: *Nov. 8, 2005

(54) METHOD OF MAKING COATED ARTICLES HAVING AN OXYGEN BARRIER COATING AND COATED ARTICLES MADE THEREBY

(75) Inventors: Harry Buhay, Allison Park, PA (US); James J. Finley, Pittsburgh, PA (US); James P. Thiel, Pittsburgh, PA (US); John P. Lehan, Silver Springs, MD (US)

(73) Assignee: PPG Industries Ohio, Inc., Cleveland, OH (US)

( * ) Notice: Subject to any disclaimer, the term of this patent is extended or adjusted under 35 U.S.C. 154(b) by 103 days.

This patent is subject to a terminal disclaimer.

(21) Appl. No.: 10/422,095

(22) Filed: Apr. 24, 2003

(65) Prior Publication Data

US 2004/0023038 A1     Feb. 5, 2004

Related U.S. Application Data

(63) Continuation-in-part of application No. 10/397,001, filed on Mar. 25, 2003, which is a continuation-in-part of application No. 10/133,805, filed on Apr. 25, 2002, which is a continuation-in-part of application No. 10/007,382, filed on Oct. 22, 2001.

(60) Provisional application No. 60/376,000, filed on Apr. 25, 2002.

(51) Int. Cl.$^7$ ............................................ B32B 9/00
(52) U.S. Cl. ..................... 428/699; 428/428; 428/432; 428/446; 428/701; 428/702
(58) Field of Search .................. 428/428, 432, 428/433, 434, 446, 697, 698, 699, 701, 702, 428/704

(56) References Cited

U.S. PATENT DOCUMENTS

| | | | |
|---|---|---|---|
| 3,281,296 A | 10/1966 | Jameson | 156/404 |
| 3,459,526 A | 8/1969 | Stickel et al. | 65/289 |
| 3,476,540 A | 11/1969 | Ritter, Jr. et al. | 65/107 |
| 3,527,589 A | 9/1970 | Ritter, Jr. | 65/289 |
| 3,769,133 A | 10/1973 | Halberschmidt et al | 156/286 |
| 4,081,934 A | 4/1978 | Franz | 51/171 |
| 4,197,108 A | 4/1980 | Frank et al. | 65/273 |
| 4,265,650 A | 5/1981 | Reese et al. | 65/104 |
| 4,272,272 A | 6/1981 | Grubka | 65/1 |
| 4,272,274 A | 6/1981 | Frank et al. | 65/273 |
| 4,504,109 A | 3/1985 | Taga et al. | 350/1.6 |
| 4,508,556 A | 4/1985 | Bennett et al. | 65/25.4 |
| 4,579,577 A | 4/1986 | Claassen | 65/273 |
| 4,584,206 A | 4/1986 | Sleighter | 427/109 |

(Continued)

FOREIGN PATENT DOCUMENTS

EP     0 997 551     5/2000

(Continued)

OTHER PUBLICATIONS

U.S. Appl. No. 10/133,805, filed Apr. 25, 2002.

(Continued)

*Primary Examiner*—Deborah Jones  
*Assistant Examiner*—Gwendolyn A. Blacwkell  
(74) *Attorney, Agent, or Firm*—Jacques B. Miles

(57) ABSTRACT

An article includes a substrate, a functional coating deposited over at least a portion of the substrate, and a protective (barrier) coating deposited over at least a portion of the functional coating. The barrier coating is stable to oxygen-containing gases and limits the transmission of oxygen-containing gases to materials over which it is deposited when subjected to conditioning steps such as heating, bending, and/or tempering.

27 Claims, 5 Drawing Sheets

U.S. PATENT DOCUMENTS

| | | | | |
|---|---|---|---|---|
| 4,610,771 | A | 9/1986 | Gillery | 204/192.1 |
| 4,661,139 | A | 4/1987 | Reese et al. | 65/106 |
| 4,716,086 | A | 12/1987 | Gillery et al. | 428/630 |
| 4,746,347 | A | 5/1988 | Sensi | 65/94 |
| 4,786,563 | A | 11/1988 | Gillery et al. | 428/630 |
| 4,792,536 | A | 12/1988 | Pecoraro et al. | 501/70 |
| 4,806,220 | A | 2/1989 | Finley | 204/192.27 |
| 4,820,902 | A | 4/1989 | Gillery | 219/203 |
| 4,830,650 | A | 5/1989 | Kelly | 65/106 |
| 4,834,857 | A | 5/1989 | Gillery | 204/192.27 |
| 4,898,789 | A | 2/1990 | Finley | 428/623 |
| 4,898,790 | A | 2/1990 | Finley | 428/623 |
| 4,900,110 | A | 2/1990 | Sleighter | 350/1.7 |
| 4,902,580 | A | 2/1990 | Gillery | 428/623 |
| 4,948,677 | A | 8/1990 | Gillery | 428/623 |
| 4,952,423 | A | 8/1990 | Hirata et al. | 427/109 |
| 5,028,759 | A | 7/1991 | Finley | 219/203 |
| 5,059,295 | A | 10/1991 | Finley | 204/192.27 |
| 5,110,662 | A | 5/1992 | Depauw et al. | 428/192 |
| 5,196,485 | A | 3/1993 | McMonigal et al. | 525/327.3 |
| 5,201,926 | A | 4/1993 | Szczyrbowski et al. | 65/60.2 |
| 5,240,886 | A | 8/1993 | Gulotta et al. | 501/70 |
| 5,250,146 | A | 10/1993 | Horvath | 156/581 |
| 5,286,271 | A | 2/1994 | Rueter et al. | 65/106 |
| 5,344,718 | A | 9/1994 | Hartig et al. | 428/623 |
| 5,376,455 | A | 12/1994 | Hartig et al. | 428/428 |
| 5,385,872 | A | 1/1995 | Gulotta et al. | 501/71 |
| 5,393,593 | A | 2/1995 | Gulotta et al. | 428/220 |
| 5,425,861 | A | 6/1995 | Hartig et al. | 204/192.26 |
| 5,532,180 | A | 7/1996 | den Boer et al. | 437/40 |
| 5,584,902 | A | 12/1996 | Hartig et al. | 65/32.4 |
| 5,653,903 | A | 8/1997 | Pinchok, Jr. et al. | 219/203 |
| 5,714,199 | A | 2/1998 | Gerhardinger et al. | 427/195 |
| 5,739,213 | A | 4/1998 | Freriks et al. | 525/438 |
| 5,811,198 | A | 9/1998 | Freriks et al. | 428/482 |
| 5,814,195 | A | 9/1998 | Lehan et al. | 204/192.12 |
| 5,820,987 | A | 10/1998 | Kaufman et al. | 428/413 |
| 5,821,001 | A | 10/1998 | Arbab et al. | 428/623 |
| 5,856,017 | A * | 1/1999 | Matsuda et al. | 428/446 |
| 5,935,702 | A | 8/1999 | Macquart et al. | 428/336 |
| 5,948,538 | A * | 9/1999 | Brochot et al. | 428/432 |
| 6,010,602 | A | 1/2000 | Arbab et al. | 204/192.27 |
| 6,078,425 | A * | 6/2000 | Wolfe et al. | 359/584 |
| 6,223,683 | B1 | 5/2001 | Plester et al. | 118/723 VE |

FOREIGN PATENT DOCUMENTS

| | | |
|---|---|---|
| FR | 2 641 271 | 7/1990 |
| GB | 2302102 | 8/1997 |
| JP | 10101825 | 4/1998 |
| WO | WO 98/58885 | * 12/1998 |

OTHER PUBLICATIONS

U.S. Appl. No. 09/058,440, filed Apr. 9, 1998.
U.S. Appl. No. 60/376,000, filed Apr. 25, 2002.
U.S. Appl. No. 10/007,382, filed Oct. 22, 2001.
U.S. Appl. No. 09/512,852, filed Feb. 25, 2000.
International Search Report Dated Nov. 5, 2003.

* cited by examiner

METHOD OF MAKING COATED ARTICLES HAVING AN OXYGEN BARRIER COATING AND COATED ARTICLES MADE THEREBY

CROSS-REFERENCE TO RELATED APPLICATION

This application is a continuation-in-part of U.S. application Ser. No. 10/397,001 filed Mar. 25, 2003, which was a continuation-in-part of U.S. application Ser. No. 10/133,805 filed Apr. 25, 2002, which was a continuation-in-part of U.S. application Ser. No. 10/007,382 filed Oct. 22, 2001. This application also claims the benefits of U.S. Provisional Application Ser. No. 60/376,000 filed Apr. 25, 2002, all of which applications are herein incorporated by reference in their entirety.

BACKGROUND OF THE INVENTION

1. Field of the Invention

This invention relates generally to coated articles having an oxygen barrier coating, e.g., coated automotive transparencies, and to methods of making the coated articles.

2. Description of the Currently Available Technology

It is known to reduce the heat build-up in the interior of a vehicle by providing a laminated windshield having two glass plies with an infrared (IR) or ultraviolet (UV) attenuating solar control coating positioned between the plies. The plies protect the solar control coating from mechanical and/or chemical damage. These conventional windshields are generally made by shaping and annealing two flat glass "blanks" (one of which has the solar control coating deposited thereon) to form two shaped, annealed glass plies and then securing the glass plies together with a plastic interlayer. Because conventional solar control coatings include metal layers that reflect heat, the glass blanks are typically heated and shaped as "doublets", i.e., the blanks are positioned one on top of another during heating and shaping with the functional coating sandwiched between the glass blanks to prevent uneven heating and cooling, which can affect the final shape of the plies. Examples of laminated automotive windshields and methods of making the same are disclosed in U.S. Pat. Nos. 4,820,902; 5,028,759; and 5,653,903.

The heatability of the doublet is generally limited by the ability of the functional coating to withstand the heat treatment without adversely degrading. By "heatability" is meant the maximum temperature and/or maximum time at a particular temperature to which the coated substrate can be heated without degradation of the functional coating. Such degradation can affect the physical and/or optical properties of the coating, such as solar energy reflection and/or transmission. Such degradation can be caused, for example, by oxidation of various metal-containing layers in the functional coating. For example, functional coatings containing metal layers can be sensitive to oxygen in that there can be some change, e.g., decrease, in the optical and/or solar control properties of the functional coating when the coated substrate is heat treated, such as by heating, bending, annealing, or tempering, for use in a motor vehicle transparency or window or vision panel, or for use in residential or commercial windows, panels, doors, or appliances.

It would also be advantageous to provide a solar control coating on other automotive transparencies, such as sidelights, back lights, sunroofs, moon roofs, etc. However, the processes of making laminated windshields are not easily adapted to making other types of laminated and/or non-laminated automotive transparencies. For example, conventional automotive sidelights are usually made from a single glass blank that is individually heated, shaped, and tempered to a desired curvature dictated by the dimensions of the vehicle opening into which the sidelight is to be installed. A problem posed in making sidelights not encountered when making windshields is the problem of individually heating glass blanks having a heat-reflecting solar control coating.

Additionally, if the sidelight is positioned such that the coating is on the surface of the sidelight facing away from the vehicle (the outer surface), the coating is susceptible to mechanical damage from objects hitting the coating and to chemical damage from acid rain or car wash detergents. If the coating is on the surface of the sidelight facing the interior of the vehicle (the inner surface), the coating is susceptible to mechanical damage from being touched by the vehicle occupants or from being rolled up and down in the window channel, and to chemical damage from contact with conventional glass cleaners. Additionally, if the coating is a low emissivity coating it can promote a greenhouse effect trapping heat inside the vehicle.

While it is known to reduce chemical damage or corrosion to a coating by overcoating with a chemically resistant material, these overcoats are typically applied as thin as possible so as not to adversely affect the optical characteristics (e.g., color, reflectance, and transmittance) of the underlying coating and so as not to significantly increase the emissivity of the underlying coating. Such thin overcoats typically do not meet the durability requirements for shipping, processing, or end use of conventional coated automotive transparencies, which are easily damaged and continuously exposed to the environment. Additionally, such thin overcoats would not alleviate the greenhouse effect problem discussed above. Examples of conventional overcoats are disclosed in U.S. Pat. Nos. 4,716,086; 4,786,563; 5,425,861; 5,344,718; 5,376,455; 5,584,902; and 5,532,180.

Therefore, it would be advantageous to provide a method of making an article, e.g., a laminated or non-laminated automotive transparency, or panel, or sheet having a functional coating that reduces or eliminates at least some of the problems discussed above.

SUMMARY OF THE INVENTION

An article of the invention comprises a substrate, a functional coating deposited over at least a portion of the substrate, and a protective (barrier) coating deposited over at least a portion of the functional coating. The functional coating and barrier coating define a coating stack. The barrier coating is stable to oxygen-containing gases and limits the transmission of oxygen-containing gases to materials over which it is deposited when subjected to conditioning processes, such as but not limited to heating, bending and tempering. The barrier coating prevents or reduces the diffusion of oxygen or oxygen-containing fluids, e.g., gasses, into the underlying functional coating, especially upon heat treatment of the coated article. The article can be a laminated article comprising two or more substrates. Alternatively, the article can be a monolithic article.

In one particular article, the functional coating can be a solar infrared reflective coating comprising at least one metal oxide-containing coating film and at least one infrared reflective metal film. The protective coating can be formed over at least a portion of the functional coating. The protective coating can comprise one or more layers, e.g., such as a single layer, comprising 0 wt. % to 100 wt. % alumina and/or 100 wt. % to 0 wt. % silica, such as 5 wt. % to 100 wt. % alumina and 95 wt. % to 0 wt. % silica, such as 50 wt.

% to 75 wt. % alumina and 50 wt. % to 25 wt. % silica. Alternatively, the protective coating can comprise two or more layers, such as a first layer comprising 5 wt. % to 100 wt. % alumina and 95 wt. % to 0 wt. % silica, such as 50 wt. % to 70 wt. % alumina and 50 wt. % to 30 wt. % silica, and a second layer comprising 30 wt. % to 100 wt. % silica and 70 wt. % to 0 wt. % alumina, such as 70 wt. % to 100 wt. % silica and 0 wt. % to 30 wt. % alumina. In one non-limiting embodiment, the protective coating can have a thickness in the range of 50 Å to 10 microns, such as greater than or equal to 100 Å to 10 microns, such as 101 Å to 10 microns, such as 1 micron to 5 microns. The protective coating can have a refractive index in the range of 1 to 3, such as in the range of 1.4 to 2.

A method of making a conditioned coated substrate comprises providing a substrate, forming at least one functional coating over at least a portion of the substrate, and forming at least one barrier coating over at least a portion of the functional coating to define a coating stack. The barrier coating is stable to oxygen-containing gases and limits the transmission of oxygen-containing gases to materials over which it is deposited. The substrate can be subjected to at least one conditioning process, such as but not limited to heating, bending, and/or tempering.

DESCRIPTION OF THE PREFERRED EMBODIMENTS

Figure 1:
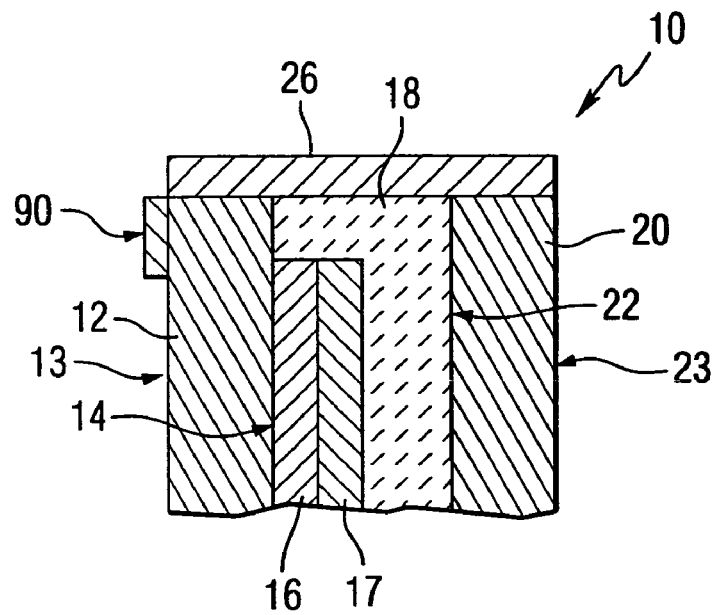
FIG. 1 is a side, sectional view (not to scale) of an edge portion of a laminated automotive transparency, e.g., a sidelight, incorporating features of the invention.

As used herein, spatial or directional terms, such as "left", "right", "inner", "outer", "above", "below", "top", "bottom", and the like, relate to the invention as it is shown in the drawing figures. However, it is to be understood that the invention may assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 5.5 to 10. The terms "flat" or "substantially flat" substrate refer to a substrate that is substantially planar in form; that is, a substrate lying primarily in a single geometric plane, which substrate, as would be understood by one skilled in the art, can include slight bends, projections, or depressions therein. Further, as used herein, the terms "formed over", "deposited over", or "provided over" mean formed, deposited, or provided on but not necessarily in contact with the surface. For example, a coating layer "formed over" a substrate does not preclude the presence of one or more other coating layers or films of the same or different composition located between the formed coating layer and the substrate. For instance, the substrate can include a conventional coating such as those known in the art for coating substrates, such as glass or ceramic. All documents referred to herein are to be understood to be incorporated by reference in their entirety. As used herein, the terms "polymer" or "polymeric" refer to oligomers, homopolymers, copolymers, and terpolymers, e.g., polymers formed from two or more types of monomers or polymers.

As will be appreciated from the following discussion, the protective (e.g., barrier) coating of the invention can be utilized in making both laminated and non-laminated, e.g., single substrate, articles. As will be appreciated from the following discussion, the protective or barrier coating of the invention can be utilized in making both laminated and non-laminated, e.g., single ply, articles. By "protective coating" or "barrier coating" is meant a film, layer or coating formed from a protective or barrier material and at a sufficient thickness to limit the transmission of oxygen-containing gases through the coating. By "protective material" or "barrier material" is meant a material having a low permeability to oxygen-containing gases, such as air or water vapor. The material can exhibit a high resistance to the passage of oxygen or air or water vapor through the material. More suitable barrier material has limited cracking when it is in the form of a coating at the conditions of the invention and is substantially stable to oxygen at such conditions. As will be appreciated by one skilled in the coating art, permeation through a material is a function of the thickness of the material. The barrier coating of the present invention exhibits a combination of relatively high resistance to both air and water vapor but some applications do not require resistance to both. Therefore, low permeability to either air or water vapor is sufficient to qualify the coating as a "barrier coating." Embodiments of barrier coatings of the present invention intended primarily as oxygen barriers can exhibit an oxygen permeability of less than about 1.5, such as less than about 1.0, such as less than about 0.5 measured as cubic centimeters of oxygen gas permeating a one-mil thick sample, 100 inches square over a 24-hour period under an oxygen partial pressure differential of one atmosphere at 23° C. and at a relative humidity of zero. The barrier coating can be stable to oxygen containing gasses so that the coating can withstand conditioning, such as heating to bend, sag, temper, or anneal, with minimal if any change in its oxygen barrier properties from those that existed before the conditioning step.

For use with laminated articles, the protective coating can usually be thinner than for non-laminated articles. The structural components and a method of making an exemplary laminated article of the invention will first be described and then an exemplary monolithic article of the invention will be described. By "monolithic" is meant having a single structural support or structural member, e.g., having a single substrate. In the following discussion, the exemplary article (whether laminated or monolithic) is described as an automotive sidelight. However, the invention is not limited to automotive sidelights but may be used with any articles, such as but not limited to, insulating glass units, residential or commercial laminated windows (e.g., skylights), or transparencies for land, air, space, above water and underwater vehicles, e.g. windshields, backlights, sun or moon roofs, just to name a few articles.

FIG. 1 illustrates a laminated article in the form of a sidelight 10 incorporating features of the invention. The laminated sidelight 10 includes a first substrate or ply 12 having an outer major surface 13 and an inner major surface 14. By "ply" is meant a substrate that has been bent to a desired shape or curvature and/or heat-treated, such as by annealing or tempering. A functional coating 16 can be formed over, e.g., on, at least a portion, preferably all, of the inner major surface 14 in any conventional manner, such as but not limited to chemical vapor deposition, magnetron sputter vapor deposition, spray pyrolysis, just to name a few. As will be described in more detail, a barrier or protective coating 17 of the invention can be formed over, e.g., on, at least a portion, preferably all, of the functional coating 16 and aids not only in increasing mechanical and chemical durability but also provides improved heating characteristics for bending and/or shaping the blank on which it is deposited. A polymeric layer 18 can be located between the first ply 12 and a second substrate or ply 20 having an inner major surface 22 and an outer major surface 23. In one non-limiting embodiment, the outer major surface 23 can face the exterior of the vehicle and the outer major surface 13 can face the interior of the vehicle. A conventional edge sealant 26 can be applied to the perimeter of the laminated sidelight 10 during and/or after lamination in any conventional manner. A decorative band 90, e.g., an opaque, translucent or colored band, such as a ceramic band, can be provided on a surface of at least one of the plies 12 and 20, for example, around the perimeter of one of the inner or outer major surfaces.

In the broad practice of the invention, the substrates used for first ply 12 and second ply 20 can be of any desired material having any desired characteristics, such as opaque, translucent, or transparent to visible light. By "transparent" is meant having a transmittance through the substrate of greater than 0% up to 100%. By "visible light" or "visible region" is meant electromagnetic energy in the range of 395 nanometers (nm) to 800 nm. Alternatively, the substrate can be translucent or opaque. By "translucent" is meant allowing electromagnetic energy (e.g., visible light) to pass through the substrate but diffusing this energy such that objects on the side of the substrate opposite to the viewer are not clearly visible. By "opaque" is meant having a visible light transmittance of 0%. Examples of suitable substrates include, but are not limited to, plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane containing polymers; or copolymers of any monomers for preparing these, or any mixtures thereof); metal substrates, such as but not limited to galvanized steel, stainless steel, and aluminum; ceramic substrates; tile substrates; glass substrates; or mixtures or combinations of any of the above. For example, the substrate can be conventional untinted soda-lime-silica-glass, i.e., "clear glass", or can be tinted or otherwise colored glass, borosilicate glass, leaded glass, tempered, untempered, annealed, or heat-strengthened glass. The glass may be of any type, such as conventional float glass or flat glass, and may be of any composition having any optical properties, e.g., any value of visible radiation transmission, ultraviolet radiation transmission, infrared radiation transmission, and/or total solar energy transmission. Types of glass suitable for the practice of the invention are described, for example but not to be considered as limiting, in U.S. Pat. Nos. 4,746,347; 4,792,536; 5,240,886; 5,385,872; and 5,393,593. The invention is not limited by the thickness of the substrate. The substrate can generally be thicker for typical architectural applications than for typical vehicle applications. In one embodiment, the substrate can be glass having a thickness in the range of 1 mm to 20 mm, such as about 1 mm to 10 mm, such as 2 mm to 6 mm, such as 3 mm to 5 mm. For forming a laminated automotive sidelight, the first and second plies 12, 20 can be less than about 3.0 mm thick, such as less than about 2.5 mm thick, such as in the thickness range of about 1.0 mm to about 2.1 mm. As described below, for monolithic articles the substrate can be thicker.

The substrate can have oxygen barrier properties, e.g., can be made of a material that prevents or limits the diffusion of oxygen through the substrate. Alternatively, another oxygen barrier coating (in addition to the barrier coating 17 described below) can be formed over at least a portion of the substrate and the functional coating 16 can be subsequently formed over this other oxygen barrier coating. The other oxygen barrier coating can be of any material to prevent or limit the diffusion of oxygen, such as but not limited to those described below for the protective coating 17.

The functional coating 16 can be of any desired type. As used herein, the term "functional coating" refers to a coating that modifies one or more physical properties of the substrate over which it is deposited, e.g., optical, thermal, chemical or mechanical properties, and is not intended to be entirely removed from the substrate during subsequent processing. The functional coating 16 can have one or more functional coating layers or films of the same or different composition or functionality. As used herein, the term "film" refers to a coating region of a desired or selected coating composition. A "layer" can comprise one or more "films" and a "coating" can comprise one or more "layers".

For example, the functional coating 16 can be an electrically conductive coating, such as, for example, an electrically conductive coating used to make heatable windows as disclosed in U.S. Pat. Nos. 5,653,903 and 5,028,759, or a single-film or multi-film coating used as an antenna. Likewise, the functional coating 16 can be a solar control coating. As used herein, the term "solar control coating" refers to a coating comprised of one or more layers or films which affect the solar properties of the coated article, such as but not limited to the amount of solar radiation, for example, visible, infrared, or ultraviolet radiation incident on and/or passing through the coated article, infrared or ultraviolet absorption or reflection, shading coefficient, emissivity, etc. The solar control coating can block, absorb or filter selected portions of the solar spectrum, such as but not limited to the IR, UV, and/or visible spectrums. Examples of solar control coatings that can be used in the practice of the invention are found, for example but not to be considered as limiting, in U.S. Pat. Nos. 4,898,789; 5,821,001; 4,716,086; 4,610,771; 4,902,580; 4,716,086; 4,806,220; 4,898,790; 4,834,857; 4,948,677; 5,059,295; and 5,028,759, and also in U.S. patent application Ser. No. 09/058,440.

The functional coating 16 can also be a low emissivity coating that allows visible wavelength energy, e.g., 395 nm to 800 nm, to be transmitted through the coating but reflects longer-wavelength solar infrared energy. By "low emissivity" is meant emissivity less than 0.4, such as less than 0.3, such as less than 0.2, such as less than 0.1, e.g., less than or equal to 0.05. Examples of low emissivity coatings are found, for example, in U.S. Pat. Nos. 4,952,423 and 4,504,109 and British reference GB 2,302,102. The functional coating 16 can be a single layer coating or multiple layer coating and can include one or more metals, non-metals, semi-metals, semiconductors, and/or alloys, compounds, composites, combinations, or blends thereof. For example, the functional coating 16 can be a single layer metal oxide coating, a multiple layer metal oxide coating, a non-metal oxide coating, a metallic nitride or oxynitride coating, or a non-metallic nitride or oxynitride coating, or a multiple layer coating.

Examples of suitable functional coatings for use with the invention are commercially available from PPG Industries, Inc. of Pittsburgh, Pa. under the SUNGATE® and SOLARBAN® families of coatings. Such functional coatings typically include one or more anti-reflective coating films comprising dielectric or anti-reflective materials, such as metal oxides or oxides of metal alloys, which are transparent to visible light. The functional coating can also include one or more infrared reflective films comprising a reflective metal, e.g., a noble metal such as gold, copper or silver, or combinations or alloys thereof, and can further comprise a primer film or barrier film, such as titanium, as is known in the art, located over and/or under the metal reflective layer. The functional coating can have any desired number of infrared reflective films, such as 1 or more silver layers, e.g., 2 or more silver layers, e.g., 3 or more silver layers.

Although not limiting to the invention, the functional coating 16 can be positioned on one of the inner major surfaces 14, 22 of the laminate to make the coating 16 less susceptible to environmental and mechanical wear than if the functional coating 16 were on an outer surface of the laminate. However the functional coating 16 could also be provided on one or both of the outer major surfaces 13 or 23. As shown in FIG. 1, a portion of the coating 16, e.g., about a 1 mm to 20 mm, such as 2 mm to 4 mm wide area around the outer perimeter of the coated region, can be removed or deleted in any conventional manner, e.g., by grinding prior to lamination or masking during coating, to minimize damage to the functional coating 16 at the edge of the laminate by weathering or environmental action during use. In addition, deletion could be done for functional performance, e.g., for antennas, heated windshields, or to improve radio-wave transmission, and the deleted portion can be of any size. For aesthetic purposes, a colored, opaque, or translucent band 90 can be provided over any surface of the plies or the coatings, for example over one or both surfaces of one or both of the plies, e.g., around the perimeter of the outer major surface 13, to hide the deleted portion. The band 90 can be made of a ceramic material and may be fired onto the outer major surface 13 in any conventional manner.

The protective (barrier) coating 17 of the invention can be formed over, e.g., on, at least a portion, preferably all, of the outer surface of the functional coating 16. The protective coating 17, among other things, can raise the emissivity of the coating stack (e.g., the functional coating plus protective coating) to be greater than the emissivity of the functional coating 16 alone. By way of example, if the functional coating 16 has an emissivity value of 0.2, the addition of the protective coating 17 can raise the emissivity value of the resultant coating stack to an emissivity of greater than 0.2. In one embodiment, the protective coating can increase the emissivity of the resulting coating stack by a factor of two or more over the emissivity of the functional coating alone (e.g., if the emissivity of the functional coating is 0.05, the addition of the protective layer can increase the emissivity of the resulting coating stack to 0.1 or more), such as by a factor of five or more, e.g., by a factor of ten or more, e.g., by a factor of twenty or more. The protective coating can increase the emissivity of the at least one functional coating and the at least one deposited (protective) coating as a stack of coatings when the functional coating has an emissivity in the range from 0.02 to 0.30, more suitably 0.03 to 0.15, by a percentage that is from less than 10 to 3,000 percent or within this range from 50 to 200 percent or 10 to 200 percent or 200 to 1,000 percent or 1,000 to 3,000 percent. In another embodiment of the invention, the protective coating 17 can raise the emissivity of the resulting coating stack to be substantially the same as the emissivity of the substrate on which the coating is deposited, e.g., within 0.2 of the emissivity of the substrate. For example, if the substrate is glass having an emissivity of about 0.84, the protective coating 17 can provide the coating stack with an emissivity in the range of 0.3 to 0.9, such as greater than 0.3, e.g., greater than 0.5, e.g., greater than 0.6, e.g., in the range of 0.5 to 0.9. As will be described below, increasing the emissivity of the functional coating 16 by deposition of the protective coating 17 improves the heating and cooling characteristics of the coated ply 12 during processing. The protective coating 17 also protects the functional coating 16 from mechanical and chemical attack during handling, storage, transport, and processing.

In one embodiment, the protective coating 17 can have an index of refraction (i.e., refractive index) that is substantially the same as that of the ply 12 to which it is laminated. For example, if the ply 12 is glass having an index of refraction of 1.5, the protective coating 17 can have an index of refraction of less than 2, such as 1.4 to 1.8, such as 1.3 to 1.8, e.g., 1.5±0.2.

The protective coating 17 can be of any desired thickness. In one exemplary laminated article embodiment, the protective coating 17 can have a thickness in the range of 100 Å to 50,000 Å, such as 500 Å to 50,000 Å, e.g., 500 Å to 10,000 Å, such a 2,000 Å, such as 300 Å to 1,500 Å, such as 500 Å to 1,000 Å, such as 800 Å. In embodiments, the protective coating 17 can have a thickness in the range of 100 Å to 10 microns, such as 101 Å to 1,000 Å, or 1,000 Å to 1 micron, or 1 micron to 10 micro 200 Å to 1,000 Å. Further, the protective coating 17 can be of non-uniform thickness across the surface of the functional coating 17. By "non-uniform thickness" is meant that the thickness of the protective coating 17 can vary over a given unit area, e.g., the protective coating 17 can have high and low spots or areas.

The protective coating 17 can be of any desired material or mixture of materials. In one exemplary embodiment, the protective coating 17 can include one or more metal oxide materials, such as but not limited to, aluminum oxide, silicon oxide, or mixtures thereof. For example, the protective coating can be a single coating layer comprising in the range of 0 wt. % to 100 wt. % alumina and/or 0 wt. % to 100 wt. % silica, such as 5 wt. % to 100 wt. % alumina and 95 wt. % to 0 wt. % silica, such as 10 wt. % to 90 wt. % alumina and 90 wt. % to 10 wt. % silica, such as 15 wt. % to 90 wt. % alumina and 85 wt. % to 10 wt. % silica, such as 50 wt. % to 75 wt. % alumina and 50 wt. % to 25 wt. % silica, such as 50 wt. % to 60 wt. % alumina and 40 wt. % to 50 wt. % silica, such as 50 wt. % to 70 wt. % alumina and 50 wt. % to 30 wt. % silica, such as 35 wt. % to 100 wt. % alumina and 65 wt. % to 0 wt. % silica, e.g., 70 wt. % to 90 wt. % alumina and 10 wt. % to 30 wt. % silica, e.g., 75 wt. % to 85 wt. % alumina and wt. % to 25 wt. % of silica, e.g., 88 wt. % alumina and 12 wt. % silica, e.g., 65 wt. % to 75 wt. % alumina and 25 wt. % to 35 wt. % silica, e.g., 70 wt. % alumina and 30 wt. % silica, e.g., 60 wt. % to less than 75 wt. % alumina and greater than 25 wt. % to 40 wt. % silica. In one non-limiting embodiment, the protective coating 17 can include 55 wt. % alumina and 45 wt. % silica. In one particular non-limiting embodiment, the protective coating 17 can include 50 wt. % to 60 wt. % alumina, such as 55 wt. % alumina and 45 wt. % silica, and can have a thickness in the range of 300 Å to 1,500 Å, such as 500 Å to 1,000 Å, such as 800 Å. Other materials, such as aluminum, chromium, hafnium, yttrium, nickel, boron, phosphorous, titanium, zirconium, and/or oxides thereof, can also be present, such as to adjust the refractive index of the coating 17. In one embodiment, the refractive index of the protective coating can be in the range of 1 to 3, such as 1 to 2, such as 1.4 to 2, such as 1.4 to 1.8.

Alternatively, the protective coating 17 can be a multilayer coating formed by separately formed layers of metal oxide materials, such as but not limited to a bilayer formed by one metal oxide containing layer (e.g., a silica and/or alumina containing first layer) formed over another metal oxide containing layer (e.g., a silica and/or alumina containing second layer). The individual layers of the multilayer protective coating 17 can be of any desired thickness.

In one embodiment, the protective coating 17 can comprise a first layer formed over the functional coating and a second layer formed over the first layer. In one non-limiting embodiment, the first layer can comprise alumina or a mixture or alloy comprising alumina and silica. For example, the first layer can comprise alumina or a silica/alumina mixture having greater than 5 wt. % alumina, such as greater than 10 wt. % alumina, such as greater than 15 wt. % alumina, such as greater than 30 wt. % alumina, such as greater than 40 wt. % alumina, such as 50 wt. % to 70 wt. % alumina, such as in the range of 70 wt. % to 100 wt. % alumina and 30 wt. % to 0 wt. % silica. In one non-limiting embodiment, the first layer can have a thickness in the range of greater than 0 Å to 1 micron, such as 50 Å to 400 Å, such as 50 Å to 200 Å, such as 50 Å to 100 Å, such as 100 Å to 250 Å, such as 101 Å to 250 Å, such as 100 Å to 150 Å, such as greater than 100 Å to 125 Å.

The second layer can comprise silica or a mixture or alloy comprising silica and alumina. For example, the second layer can comprise a silica/alumina mixture having greater than 40 wt. % silica, such as greater than 50 wt. % silica, such as greater than 60 wt. % silica, such as greater than 70 wt. % silica, such as greater than 80 wt. % silica, such as in the range of 80 wt. % to 95 wt. % silica and 5 wt. % to 20 wt. % alumina, such as in the range of 80 wt. % to 90 wt. % silica and 10 wt. % to 20 wt. % alumina, e.g., 85 wt. % silica and 15 wt. % alumina. In one non-limiting embodiment, the second layer can have a thickness in the range of greater than 0 Å to 2 microns, such as 50 Å to 5,000 Å, such as 50 Å to 2,000 Å, such as 100 Å to 1,000 Å, such as 300 Å to 1,000 Å, such as 300 Å to 500 Å, such as 350 Å to 400 Å. As described below, the presence of the protective coating 17 can improve the heatability of the functionally coated substrate.

In one particular non-limiting embodiment, the first layer can include 100 wt. % alumina and can have a thickness in the range of 50 Å to 200 Å, such as 125 Å. The second layer can include 5 wt. % to 20 wt. % alumina and 80 wt. % to 95 wt. % silica and can have a thickness in the range of 300 Å to 1,000 Å, such as 500 Å. In another non-limiting embodiment, the first layer can include 50 wt. % to 60 wt. % alumina and 40 wt. % to 50 wt. % silica, such as 55 wt. % alumina and 45 wt. % silica, and can have a thickness in the range of 50 Å to 400 Å, such as 200 Å. The second layer can include 5 wt. % to 20 wt. % alumina and 80 wt. % to 95 wt. % silica and can have a thickness in the range of 300 Å to 1,000 Å, such as 500 Å.

The polymeric layer 18 can include any polymeric material. The "polymeric material" can comprise one polymeric component or can comprise a mixture of different polymeric components, such as but not limited to one or more plastic materials, such as but not limited to one or more thermoset or thermoplastic materials. The polymeric layer 18 can adhere the plies together. Useful thermoset components include polyesters, epoxides, phenolics, and polyurethanes such as reaction injected molding urethane (RIM) thermoset materials and mixtures thereof. Useful thermoplastic materials include thermoplastic polyolefins such as polyethylene and polypropylene, polyamides such as nylon, thermoplastic polyurethanes, thermoplastic polyesters, acrylic polymers, vinyl polymers, polycarbonates, acrylonitrile-butadiene-styrene (ABS) copolymers, EPDM rubber, copolymers and mixtures thereof.

Suitable acrylic polymers include copolymers of one or more of acrylic acid, methacrylic acid and alkyl esters thereof, such as methyl methacrylate, ethyl methacrylate, hydroxyethyl methacrylate, butyl methacrylate, ethyl acrylate, hydroxyethyl acrylate, butyl acrylate and 2-ethylhexyl acrylate. Other suitable acrylics and methods for preparing the same are disclosed in U.S. Pat. No. 5,196,485.

Useful polyesters and alkyds can be prepared in a known manner by condensation of polyhydric alcohols, such as ethylene glycol, propylene glycol, butylene glycol, 1,6-hexylene glycol, neopentyl glycol, trimethylolpropane and pentaerythritol, with polycarboxylic acids such as adipic acid, maleic acid, fumaric acid, phthalic acids, trimellitic acid or drying oil fatty acids. Examples of suitable polyester materials are disclosed in U.S. Pat. Nos. 5,739,213 and 5,811,198.

Useful polyurethanes include the reaction products of polymeric polyols such as polyester polyols or acrylic polyols with a polyisocyanate, including aromatic diisocyanates such as 4,4'-diphenylmethane diisocyanate, aliphatic diisocyanates such as 1,6-hexamethylene diisocyanate, and cycloaliphatic diisocyanates such as isophorone diisocyanate and 4,4'-methylene-bis(cyclohexyl isocyanate). The term "polyurethane" as used herein is intended to include polyurethanes as well as polyureas, and poly(urethane-ureas).

Suitable epoxy-functional materials are disclosed in U.S. Pat. No. 5,820,987.

Useful vinyl resins include polyvinyl acetyl, polyvinyl formal, and polyvinyl butyral.

The polymeric layer 18 can have any desired thickness, e.g., in one non-limiting embodiment for polyvinyl butyral the thickness can be in the range of 0.50 mm to about 0.80 mm, such as 0.76 mm. The polymeric material can have any desired refractive index. In one embodiment, the polymeric material has a refractive index in the range of 1.4 to 1.7, such as 1.5 to 1.6.

The protective coating 17 can have an index of refraction that is substantially the same as the refractive index of the polymeric layer 18 material. By "substantially the same" refractive index is meant that the refractive index of the protective coating material and the polymeric layer material are the same or sufficiently close that little or no undesirable optical effects, such as undesirable changes in color, reflectance, or transmittance are caused by the presence of the protective coating 17. In effect, the protective coating 17 behaves optically as if it were a continuation of the polymeric layer material. The presence of the protective coating 17 preferably does not cause the introduction of an optically undesirable interface between the protective coating 17 and the polymeric layer 18. In one embodiment, the protective coating 17 and polymeric layer 18 can have indices of refraction that are within ±0.2 of each other, such as within ±0.1, such as within ±0.05. By providing that the refractive index of the protective coating material is the same as or substantially the same as the refractive index of the polymeric layer material, the presence of the protective coating 17 does not adversely impact upon the optical properties of the laminated article compared to the optical properties of the laminated article without the protective coating 17. For example, if the polymeric layer 18 comprises polyvinyl butyral having an index of refraction of 1.5, the protective coating 17 can be selected or formed to have an index of refraction of less than 2, such as 1.3 to 1.8, e.g., 1.5±0.2.

An exemplary method of making a laminated sidelight 10 utilizing features of the invention will now be discussed.

A first substrate and a second substrate are provided. The first and second substrates can be flat glass blanks having a thickness of about 1.0 mm to 6.0 mm, typically about 1.0 mm to about 3.0 mm, such as about 1.5 mm to about 2.3 mm. A functional coating 16 can be formed over at least a portion of a major surface of the first glass substrate, for example, the major surface 14. The functional coating 16 can be formed in any conventional manner, such as but not limited to, magnetron sputter vapor deposition (MSVD), pyrolytic deposition such as chemical vapor deposition (CVD), spray pyrolysis, atmospheric pressure CVD (APCVD), low-pressure CVD (LPCVD), plasma-enhanced CVD (PEVCD), plasma assisted CVD (PACVD), or thermal evaporation by resistive or electron-beam heating, cathodic arc deposition, plasma spray deposition, wet chemical deposition (e.g., sol-gel, mirror silvering, etc.), or any other desired manner. For example, the functional coating 16 can be formed over the first substrate after the first substrate is cut to a desired dimension. Alternatively, the functional coating 16 can be formed over a glass sheet before it is processed and/or over a float glass ribbon supported on a bath of molten metal, e.g., tin, in a conventional float chamber by one or more conventional CVD coaters positioned in the float chamber. Upon exiting the float chamber, the ribbon can be cut to form the coated first substrate.

Alternatively, the functional coating 16 can be formed over the float glass ribbon after the ribbon exits the float chamber. For example, U.S. Pat. Nos. 4,584,206, 4,900,110, and 5,714,199 disclose methods and apparatus for depositing a metal-containing film on the bottom surface of a glass ribbon. Such a known apparatus can be located downstream of a molten tin bath in the float glass process to provide a functional coating on the bottom of the glass ribbon, i.e., the side of the ribbon that was in contact with the molten metal. Still further, the functional coating 16 can be formed over the first substrate by MSVD after the substrate has been cut to a desired dimension.

A protective coating 17 of the invention can be formed over at least a portion of the functional coating 16. The protective coating 17 provides several processing advantages in making the laminated article. For example, the protective coating 17 can protect the functional coating 16 from mechanical and/or chemical attack during handling, transport, storage, and processing. Additionally, as described below, the protective coating 17 can facilitate individual heating and cooling of the functionally coated blank by increasing the emissivity of the resulting coating stack. While topcoats have been applied onto functional coatings in the past to help protect the functional coating from chemical and mechanical attack during processing, these topcoats were made as thin as possible so as not to impact upon the aesthetic or solar control properties of the functional coating, such as the coating emissivity. Conversely, in the present invention, the protective coating 17 can be made sufficiently thick so as to raise the emissivity of the coating stack. Further, by substantially matching the index of refraction of the protective coating 17 to that of the polymeric layer 18 material (and/or the substrate to which it is laminated), there is little or no adverse impact by the presence of the protective coating 17 upon the aesthetic and/or optical characteristics of the laminated article 10.

If the functional coating 16 is a low emissivity coating having one or more infrared reflecting metal layers, the addition of the protective coating 17 to raise the emissivity of the coating stack reduces the thermal infrared reflecting characteristics of the functional coating 16. However, the coating stack remains solar infrared reflective.

The protective coating 17 can be formed in any conventional manner, such as but not limited to those described above for applying the functional coating, e.g., in-bath or out-of-bath CVD, MSVD; or sol-gel, just to name a few. For example, the substrate with the functional coating can be directed to a conventional MSVD coating apparatus having one or more metal electrodes, e.g., cathodes, that can be sputtered in an oxygen-containing atmosphere to form a metal oxide protective coating. In one non-limiting embodiment, the MSVD apparatus can include one or more cathodes of aluminum, silicon, or mixtures or alloys of aluminum or silicon. The cathodes can be for example, 5 wt. % to 100 wt. % aluminum and 95 wt. % to 0 wt. % silicon, such as 10 wt. % to 100 wt. % aluminum and 90 wt. % to 0 wt. % silicon, such as 35 wt. % to 100 wt. % aluminum and 0 wt. % to 65 wt. % silicon, e.g., 50 wt. % to 80 wt. % aluminum and 20 wt. % to 50 wt. % silicon, e.g., 70 wt. % aluminum and 30 wt. % silicon. Additionally, other materials or dopants, such as aluminum, chromium, hafnium, yttrium, nickel, boron, phosphorous, titanium, or zirconium, can also be present to facilitate sputtering of the cathode(s) and/or to affect the refractive index or durability of the resultant coating. As described above, the protective coating 17 can be formed as a single layer comprising one or more metal oxide materials or as a multilayer coating having two or more separate layers, with each separate layer comprising one or more metal oxide materials. The protective coating 17 can be applied in a sufficient amount or to a sufficient thickness to raise the emissivity of the coating stack over that of just the functional coating alone. In one embodiment, the protective coating can be applied to a thickness in the range of 100 Å to 50,000 Å and/or to raise the emissivity of the coating stack to greater than or equal to about 0.3, e.g., greater than or equal to 0.4, e.g., greater than or equal to 0.5.

The functional coating 16 and/or protective coating 17 can be applied to the flat substrate or to the substrate after the substrate has been bent and shaped to a desired contour.

The coated first substrate and uncoated second substrate can be cut to provide a first, coated ply and a second, uncoated ply, respectively, each having a desired shape and desired dimensions. The coated and uncoated plies can be seamed, washed, bent, and shaped to a desired contour to form the first and second plies 12 and 20, respectively, to be laminated. As can be appreciated by one of ordinary skill in the art, the overall shapes of the coated and uncoated blanks and plies depend upon the particular vehicle into which they will be incorporated, since the final shape of a sidelight differs between different automotive manufacturers.

Figure 2:
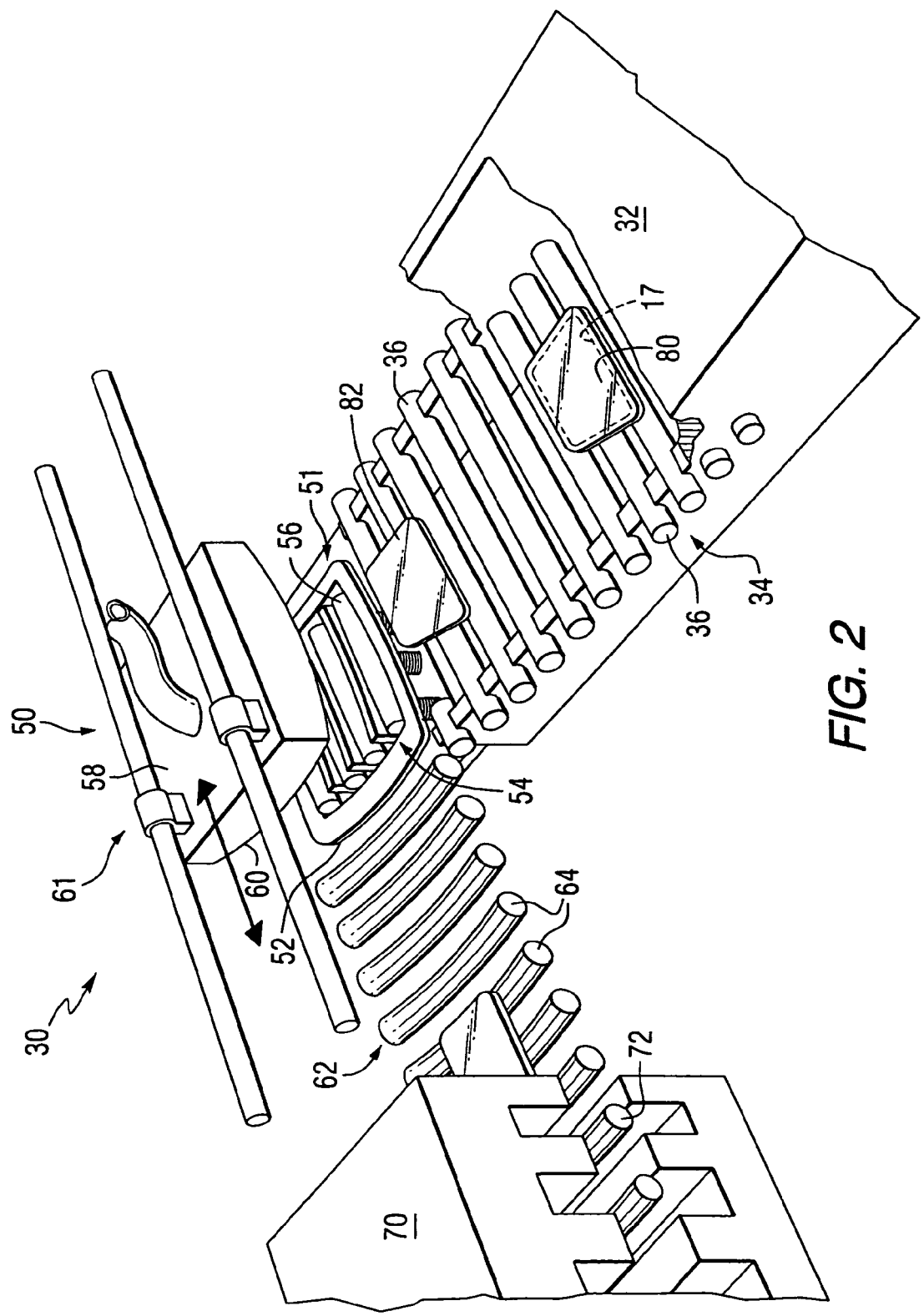
FIG. 2 is a perspective, partially broken view of an apparatus (with portions removed for clarity) for producing glass blanks G (coated or uncoated) in the practice of the invention.

The coated and uncoated blanks can be shaped using any desired process. For example, the blanks can be shaped using the "RPR" process disclosed in U.S. Pat. No. 5,286,271 or the modified RPR process disclosed in U.S. patent application Ser. No. 09/512,852. FIG. 2 shows an additional RPR apparatus 30 suitable for the practice of the invention and includes a furnace 32, e.g., a radiant heat furnace or tunnel Lehr, having a furnace conveyor 34 comprised of a plurality of spaced furnace conveyor rolls 36. Heaters, such as radiant heater coils, can be positioned above and/or below the furnace conveyor 34 along the length of the furnace 32 and can be controlled to form heating zones of different temperature along the length of the furnace 32.

A shaping station 50 can be located adjacent the discharge end of the furnace 32 and can include a lower mold 51 having a vertically movable flexible ring 52 and a shaping station conveyor 54 having a plurality of rolls 56. An upper vacuum mold 58 having a removable or reconfigurable shaping surface 60 of a predetermined shape can be located above the lower mold 51. The vacuum mold 58 can be movable via a shuttle arrangement 61.

A transfer station 62 having a plurality of shaped transfer rolls 64 can be located adjacent a discharge end of the shaping station 50. The transfer rolls 64 can have a transverse elevational curvature corresponding substantially to the transverse curvature of the shaping surface 60.

A tempering or cooling station 70 can be located adjacent a discharge end of the transfer station 62 and can include a plurality of rolls 72 to move the blanks through the station 70 for cooling, tempering, and/or heat strengthening. The rolls 72 can have a transverse elevational curvature substantially the same as that of the transfer rolls 64.

In the past, heating functionally coated blanks (substrates) presented difficulties due to the heat reflectance of the functional coating 16, which caused uneven heating of the coated and uncoated sides of the blank. U.S. patent application Ser. No. 09/512,852 discloses a method of overcoming this problem by modifying the RPR heating process to supply heat primarily toward the non-functionally coated surface of the blank. In the present invention, this problem is addressed by deposition of the emissivity increasing protective coating 17, which allows the same or substantially the same heating process to be used both for the functionally coated and non-functionally coated blanks.

As shown in FIG. 2, the first blank 80 with the coating stack (e.g., functional coating 16 and protective coating 17) and the non-functionally coated second blank 82 can be individually heated, shaped, and cooled prior to lamination. By "individually heated" is meant that the blanks are not stacked one on top of the other during heating. In one embodiment, the first blank 80 is placed on the furnace conveyor 34 with the protective coating 17 facing downwardly, i.e., in contact with the furnace conveyor rolls 36, during the heating process. The presence of the higher emissivity protective coating 17 reduces the problem of heat reflectance by the metal layers of the functional coating 16 and promotes more even heating of the coated and uncoated sides of the first blank 80. This helps prevent curling of the first blank 80 common in prior heating processes. In one exemplary embodiment, the blanks are heated to a temperature of about 640° C. to 704° C. during a period of about 10 mins to 30 mins.

At the end of the furnace 32, the softened glass blanks, whether coated 80 or non-coated 82, are moved from the furnace 32 to the shaping station 50 and onto the lower mold 51. The lower mold 51 moves upwardly, lifting the glass blank to press the heat-softened glass blank against the shaping surface 60 of the upper mold 58 to conform the glass blank to the shape, e.g., curvature, of the shaping surface 60. The upper surface of the glass blank is in contact with the shaping surface 60 of the upper mold 58 and is held in place by vacuum.

The shuttle arrangement 61 is actuated to move the upper vacuum mold 58 from the shaping station 50 to the transfer station 62, where the vacuum is discontinued to release the shaped glass blank onto the curved transfer rolls 64. The transfer rolls 64 move the shaped glass blank onto the rolls 72 and into the cooling station 70 for tempering or heat strengthening in any convenient manner. In the cooling station 70, air is directed from above and below the shaped glass blanks to temper or heat strengthen the glass blanks to form the first and second plies 12 and 20. The presence of the high emissivity protective coating 17 also promotes more even cooling of the coated blank 80 in the cooling station 70.

In another embodiment, the coated and uncoated blanks can be heated and/or shaped as doublets. In one embodiment, the coated and uncoated blanks can be positioned such that the functional coating 16 with the protective coating 17 is located between the two blanks. The blanks can then be heated and/or shaped in any conventional manner. It is believed that the protective coating 17 acts as an oxygen barrier to reduce or prevent oxygen passing into the functional coating 16 where the oxygen could react with components of the functional coating 16, such as but not limited to metals (e.g., silver), to degrade the functional coating 16. In one conventional method, the doublet can be placed on a support and heated to sufficient temperature to bend or shape the blanks to a desired final contour. In the absence of the protective coating 17, typical functionally coated blanks cannot withstand a heating cycle having heating above about 1100° F. (593° C.) for more than about two minutes (with heating above 900° F. (482° C.) for more than about six minutes during the heating cycle) without degradation of the functional coating 16. Such degradation can take the form of a hazy or yellowish appearance with a decrease in visible light transmission of 10% or more. Metal layers in the functional coating 16, such as silver layers, can react with oxygen diffusing into the functional coating 16 or with oxygen present in the functional coating 16. However, it is believed that utilizing the protective coating 17 will permit the functionally coated blank to withstand a heating cycle with heating to a temperature of 1100° F. (593° C.) or more for a period of five to fifteen minutes, such as five to ten minutes, such as five to six minutes (with heating above 900° F. (482° C.) for ten to twenty minutes, such as ten to fifteen minutes, such as ten to twelve minutes during the heating cycle), with no significant degradation of the functional coating 16, e.g., with less than 5% loss of visible light transmission, such as less than 3% loss, such as less than 2% loss, such as less than 1% loss, such as no loss of visible light transmission.

To form the laminated article 10 of the invention, the coated glass ply 12 is positioned with the coated inner major surface 14 facing the substantially complimentary inner major surface 22 of the non-coated ply 20 and separated therefrom by the polymeric layer 18. A portion, e.g. a band of about 2 mm in width, of the coating 16 and/or protective coating 17 can be removed from around the perimeter of the first ply 12 before lamination. The ceramic band 90 can be provided on one or both of the plies 12 or 20, e.g., on the outer surface 13 of the first ply 12, to hide the non-coated peripheral edge region of the laminated sidelight and/or to provide additional shading to passengers inside the vehicle. The first ply 12, polymeric layer 18 and second ply 20 can be laminated together in any convenient manner, for example but not to be considered as limiting, as disclosed in U.S. Pat. Nos. 3,281,296; 3,769,133; and 5,250,146 to form the laminated sidelight 10 of the invention. An edge sealant 26 can be applied to the edge of the sidelight 10, as shown in FIG. 1.

Although the above method of forming the laminated sidelight 10 of the invention utilizes an RPR apparatus and method, the sidelight 10 of the instant invention may be formed with other methods, such as horizontal press bending methods disclosed, for example, in U.S. Pat. Nos. 4,661,139; 4,197,108; 4,272,274; 4,265,650; 4,508,556; 4,830,650; 3,459,526; 3,476,540; 3,527,589; and 4,579,577.

Figure 3:
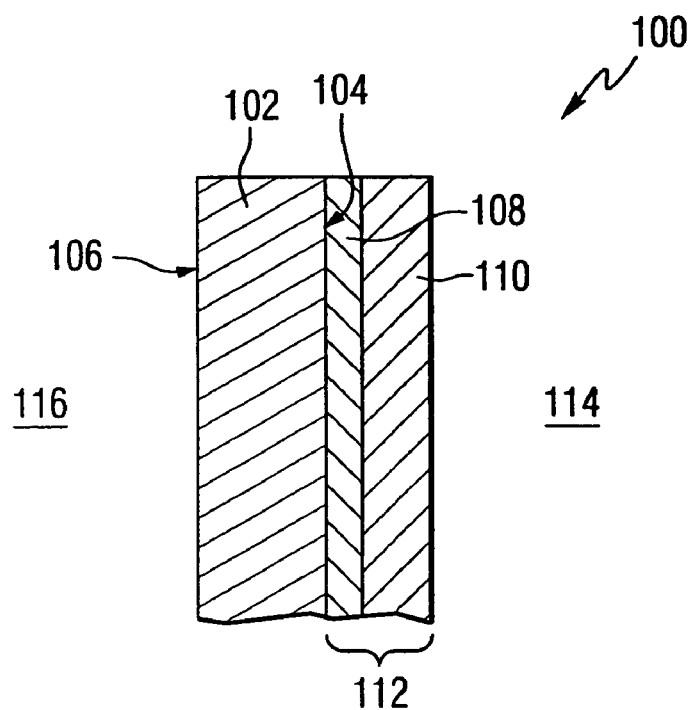
FIG. 3 is a side, sectional view (not to scale) of a portion of a monolithic article incorporating features of the invention.

FIG. 3 illustrates a monolithic article 100, in particular a monolithic automotive transparency, incorporating features of the invention. The article 100 includes a substrate or ply 102 having a first major surface 104 and a second major surface 106. A functional coating 108 can be formed over at least a portion, such as the majority, e.g., all, of the surface area of the first major surface 104. A protective coating 110 of the invention can be formed over at least a portion, such as the majority, e.g., all, of the surface area of the functional coating 108. The functional coating 108 and protective coating 110 can be formed in any desired method, such as those described above. The functional coating 108 and protective coating 110 define a coating stack 112. The coating stack 112 can include other coating layers or films, such as but not limited to a conventional color suppression layer or a sodium ion diffusion barrier layer, just to name a few. An optional polymeric layer 113, such as comprising one or more polymeric materials such as those described above, can be deposited over the protective coating 110 in any desired manner.

The ply 102 can be of any desired material, such as those described above for the plies 12, 20 and can be of any desired thickness. In one non-limiting embodiment for use as a monolithic automotive sidelight, the ply 102 can have a thickness of less than or equal to 20 mm, e.g., less than about 10 mm, such as about 2 mm to about 8 mm, e.g., about 2.6 mm to about 6 mm.

The functional coating 108 can be of any desired type or thickness, such as those described above for the functional coating 16. In one embodiment, the functional coating 108 is a solar control coating having a thickness of about 600 Å to about 2400 Å.

The protective coating 110 can be of any desired material and have any desired structure, such as those described above for the protective coating 17. The protective coating 110 of the invention can be formed in an amount sufficient to increase, e.g., significantly increase, the emissivity of the coating stack 112 over the emissivity of just the functional coating 108 alone. For one exemplary monolithic article, the protective coating 110 can have a thickness of greater than or equal to 1 micron, such as in the range of 1 micron to 5 microns. In one embodiment, the protective coating 110 increases the emissivity of the coating stack 112 by at least a factor of 2 over the emissivity of the functional coating 108 alone (i.e., if the emissivity of the functional coating 108 is 0.05, the addition of the protective coating 110 increases the emissivity of the resultant coating stack 112 to at least 0.1). In another embodiment, the protective coating 110 increases the emissivity by at least a factor of 5, such as by a factor of 10 or more. In a further embodiment, the protective coating 110 increases the emissivity of the coating stack 112 to 0.5 or more, such as greater than 0.6, e.g., in the range of about 0.5 to about 0.8.

Increasing the emissivity of the coating stack 112 maintains the solar energy reflectance of the functional coating 108 (e.g., reflectance of electromagnetic energy in the range of 700 nm to 2100 nm) but decreases the thermal energy reflecting capability of the functional coating 108 (e.g., reflectance of electromagnetic energy in the range of 5000 nm to 25,000 nm). Increasing the emissivity of the functional coating 108 by formation of the protective coating 110 also improves the heating and cooling characteristics of the coated substrate during processing, as described above in discussing the laminated article. The protective coating 110 also protects the functional coating 108 from mechanical and chemical attack during handling, storage, transport, and processing.

The protective coating 110 can have an index of refraction that is the same or substantially the same as that of the ply 102 over which it is deposited. For example, if the ply 102 is glass having an index of refraction of 1.5, the protective coating 110 can have an index of refraction of less than 2, such as 1.3 to 1.8, such as 1.4 to 1.8, e.g., 1.5±0.2. Additionally or alternatively, the protective coating 110 can have a refractive index that is substantially the same as the refractive index of the polymeric layer 113.

The protective coating 110 can be of any thickness. In one monolithic embodiment, the protective coating 110 can have a thickness of 1 micron or more to reduce or prevent a color variation in the appearance of the article 100. The protective coating 110 can have a thickness less than 5 microns, such as in the range of 1 to 3 microns. In one embodiment, the protective coating 110 can be sufficiently thick to pass the conventional ANSI/SAE 26.1-1996 test with less than 2% gloss loss over 1000 revolutions in order to be used as an automotive transparency. The protective coating 110 need not be of uniform thickness across the surface of the functional coating 108 but may have high and low spots or areas.

The protective coating 110 can be a single layer comprising one or more metal oxide materials, such as those described above. Alternatively, the protective coating 110 can be a multilayer coating having two or more coating layers, such as described above. Each coating layer can comprise one or more metal oxide materials. For example, in one embodiment, the protective coating 110 can comprise a first layer comprising aluminum oxide and a second layer comprising silicon oxide. The individual coating layers can be of any desired thickness, such as described above.

The substrate with the coating stack 112 can be heated and/or shaped in any desired manner, such as that described above for heating the coated blank of the laminated article.

The optional polymeric layer 113 can include one or more polymeric components, such as those described above for polymeric layer 18. The polymeric layer 113 can be of any desired thickness. In one non-limiting embodiment, the polymeric layer 113 can have a thickness greater than 100 Å, such as greater than 500 Å, such as greater than 1000 Å, such as greater than 1 mm, such as greater than 10 mm, such as in the range of 100 Å to 10 mm. The polymeric layer 113 can be a permanent layer (i.e., not intended to be removed) or can be a temporary layer. By "temporary layer" is meant a layer intended to be removed, such as but not limited to removal by combustion or washing with a solvent, in a subsequent processing step. The polymeric layer 113 can be formed by any conventional method.

The monolithic article 100 is particularly useful as an automotive transparency. As used herein, the term "automotive transparency" refers to an automotive sidelight, back light, moon roof, sunroof, and the like. The "transparency" can have a visible light transmission of any desired amount, e.g., 0% to 100%. For vision areas, the visible light transmission is preferably greater than 70%. For non-vision areas, the visible light transmission can be less than 70%.

If the ply 102 with only the functional coating 108 were used as an automotive transparency, such as a sidelight, the low emissivity functional coating 108 could reduce solar energy passing into the automobile but could also promote a greenhouse effect trapping thermal energy inside the automobile. The protective coating 110 of the invention overcomes this problem by providing a coating stack 112 having a low emissivity functional coating 108 (e.g., emissivity of 0.1 or less) on one side of the coating stack 112 and a high emissivity protective coating 110 (e.g., emissivity of 0.5 or more) on the other side. The solar reflecting metal layers in the functional coating 108 reduce solar energy passing into the interior of the automobile and the high emissivity protective coating 110 reduces the greenhouse effect and permits thermal energy inside the automobile to be removed. Additionally, layer 110 (or layer 17) can be solar absorbing in one or more of the UV, IR, and/or visible regions of the electromagnetic spectrum.

With respect to FIG. 3, the article 100 can be placed in an automobile with the protective coating 110 facing a first side 114 of the automobile and the ply 102 facing a second side 116 of the automobile. If the first side 114 faces the exterior of the vehicle, the coating stack 112 will reflect solar energy due to the reflective layers present in the functional coating 108. However, due to the high emissivity, e.g., greater than 0.5, of the coating stack 112, at least some of the thermal energy will be absorbed. The higher the emissivity of the coating stack 112, the more thermal energy will be absorbed. The protective coating 110, in addition to providing increased emissivity to the coating stack 112, also protects the less durable functional coating 108 from mechanical and chemical damage. The optional polymeric layer 113 can also provide mechanical and/or chemical durability.

Alternatively, if the first side 114 faces the interior of the vehicle, the article 100 still provides solar reflectance due to the metal layers in the functional coating 108. However, the presence of the protective coating 110 reduces thermal energy reflectance by absorbing the thermal energy to prevent the thermal energy from heating the car interior to elevate its temperature and reduces the greenhouse effect. Thermal energy from the interior of the vehicle is absorbed by the protective coating 110 and is not reflected back into the interior of the vehicle.

Although particularly useful for automotive transparencies, the coating stack of the invention should not be considered as limited to automotive applications. For example, the coating stack can be incorporated into a conventional insulating glass (IG) unit, e.g., can be provided on a surface, either inner or outer surface, of one of the glass sheets forming the IG unit. If on an inner surface in the air space, the coating stack would not have to be as mechanically and/or chemically durable as it would if on an outer surface. Additionally, the coating stack could be used in a seasonably adjustable window, such as disclosed in U.S. Pat. No. 4,081,934. If on an outer surface of the window, the protective coating should be sufficiently thick to protect the functional coating from mechanical and/or chemical damage. The invention could also be used as a monolithic window.

Illustrating the invention are the following examples which, however, are not to be considered as limiting the invention to their details. All parts and percentages in the following examples, as well as throughout the specification are by weight unless otherwise indicated.

EXAMPLE 1

Several Samples of functional coatings with different protective coatings of the invention were prepared and tested for durability, scattered light haze developed after Taber abrasion, and emissivity. The functional coatings were not optimized for mechanical or optical properties but were utilized simply to illustrate the relative properties, e.g., durability, emissivity, and/or haze, of a functionally-coated substrate having a protective coating of the invention. Methods of preparing such functional coatings are described, for example but not to be considered as limiting, in U.S. Pat. Nos. 4,898,789 and 6,010,602.

Test samples were produced by overcoating different functional coatings as described below (on common soda lime clear glass) with aluminum oxide protective coatings incorporating features of the invention and having thickness in the range of 300 Å to 1.5 microns. The functional coatings used in the tests have high solar infrared reflectance and characteristic low emissivity and are comprised of multilayer interference thin films achieved by depositing alternating layers of zinc stannate and silver by magnetron sputtering vacuum deposition (MSVD). For the samples discussed below, typically two silver layers and three zinc stannate layers were present in the functional coating. Thin titanium metal primer layers are also used in the functional coatings on top of the silver layers to protect the silver layers from oxidation during MSVD deposition of the oxide zinc stannate layers and to survive heating to bend the glass substrate. The two functional coatings used in the following examples differ mainly in the outermost thin layer of the multilayer coating, one being metallic Ti and the other being oxide TiO2. Thickness of either the Ti or $TiO_2$ outer layer is in the range 10 Å to 100 Å. Alternative examples which are equally applicable but which were not prepared are functional coatings without a Ti or TiO2 outer layer or different metallic or oxide outer layers. The functional coatings used for the examples having the thin Ti outer layer have a blue reflecting color after heating and with the $TiO_2$ outer layer have a green reflecting color after heating. Other resulting reflecting colors of functional coatings after heating which can be protected with a protective coating of the invention can be achieved by changing the thickness of the individual silver and zinc stannate layers in the functional coating.

Thin or thick aluminum oxide protective coatings for the following examples were deposited by mid-frequency, bi-polar, pulsed dual magnetron reactive sputtering of Al in an Airco ILS 1600, specially modified to power two of the three targets. Power was provided by an Advanced Energy(AE) Pinnacle® Dual DC power supply and Astral® switching accessory, that converts the DC supply to a bi-polar, pulsed supply. Glass substrates with the functional coating were introduced into the Airco ILS 1600 MSVD coater having an oxygen reactive oxygen/argon atmosphere. Two aluminum cathodes were sputtered for different times to achieve the different thickness aluminum oxide coatings over the functional coatings.

Three sample coupons (Samples A–C) were prepared and evaluated as follows:
Sample A—4 inch by 4 inch (10 cm by 10 cm) pieces of 2 mm thick clear float glass commercially available from PPG Industries, Inc., of Pittsburgh, Pa.
Sample B—4 inch by 4 inch (10 cm by 10 cm) pieces of 2 mm thick clear glass coupons having an experimental low emissivity functional coating approximately 1600 Å thick with green reflecting color produced by MSVD (as described above) and no protective aluminum oxide protective coating were used as a control sample.
Sample C—4 inch by 4 inch (10 cm by 10 cm) pieces of 2 mm thick glass coupons having an experimental functional coating approximately 1600 Å thick with blue reflecting color produced by MSVD but further having a 1.53 micron thick aluminum oxide ($Al_2O_3$) protective coating of the invention deposited over the functional coating.

Figure 4:
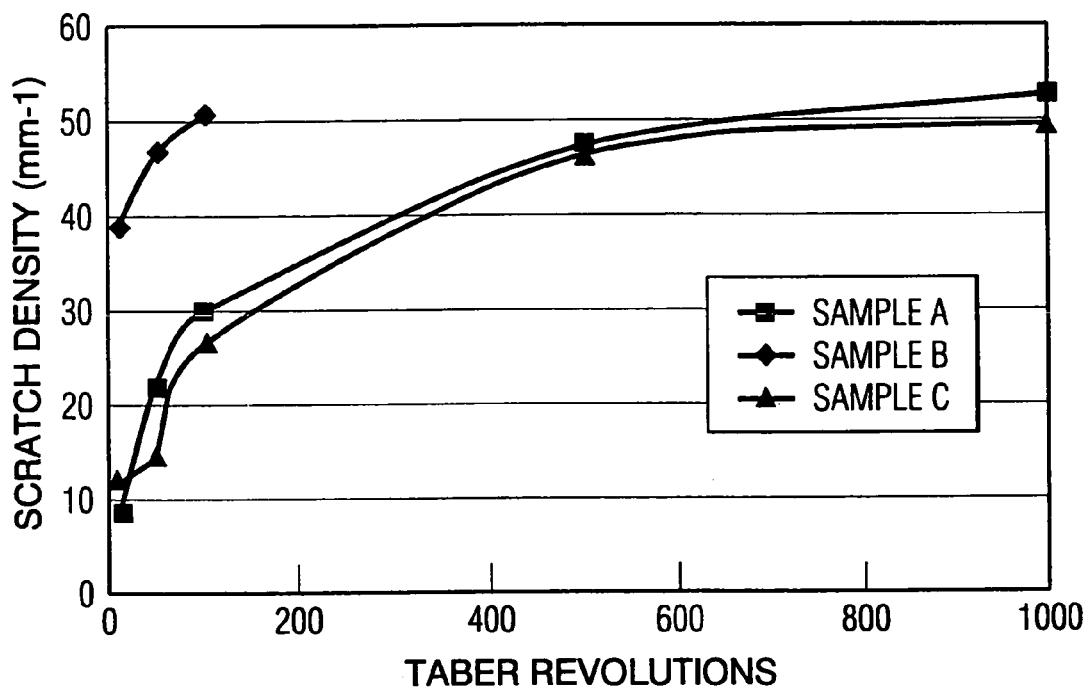
FIG. 4 is a graph showing Taber abrasion test results for substrates having a protective coating of the invention compared to substrates without the protective coating.

Replicate Samples A–C were then tested in accordance with a standard Taber Abrasion Test (ANSI/SAE 26.1-1996) and the results are shown in FIG. 4. Scratch density (SD) measurements after Taber for a given number of cycles were determined by microscope measurements of the total scratch length of all scratches in a square micron area using digitizing and image analysis software. The Sample C (protective coated) coupons showed a lower scratch density than the Sample B (functionally coated) coupons. The Sample C coupons had about the same durability as the uncoated glass coupons of Sample A. The Taber results were obtained for the "as deposited" protective coating, meaning the coated glass coupons were not post-heated after MSVD deposition of the protective coating. It is expected that the scratch density results should improve (i.e., the scratch density for few Taber cycles should decrease) upon heating of the coated substrate due to increased density of the heated coating stack. For example, the coated substrates could be heated from ambient to a maximum temperature in the range of 640° C. to 704° C. and cooled over a time period of about 10 mins to about 30 mins.

Figure 5:
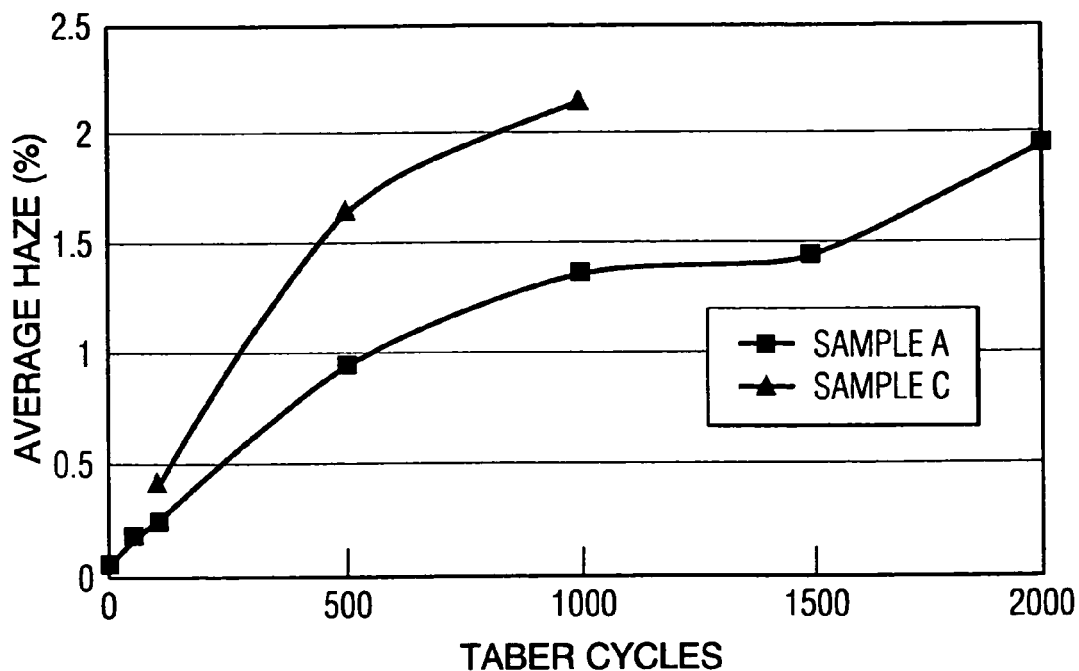
FIG. 5 is a graph of the average haze for selected substrates of FIG. 4.

FIG. 5 shows the average scattered light haze versus Taber cycles (in accordance with ANSI/SAE 26.1-1996) for replicate Samples A and C as described above. Sample A is uncoated glass used as a control. Results indicate that the haze that develops for Sample C after 1000 cycles is close to 2%, the minimum acceptable specified by ANSI for automotive glazing safety. A modest improvement in the durability of the protective coating is expected to result in less than 2% haze after 1000 Taber cycles, exceeding the ANSI safety specification for automotive glazing.

Figure 6:
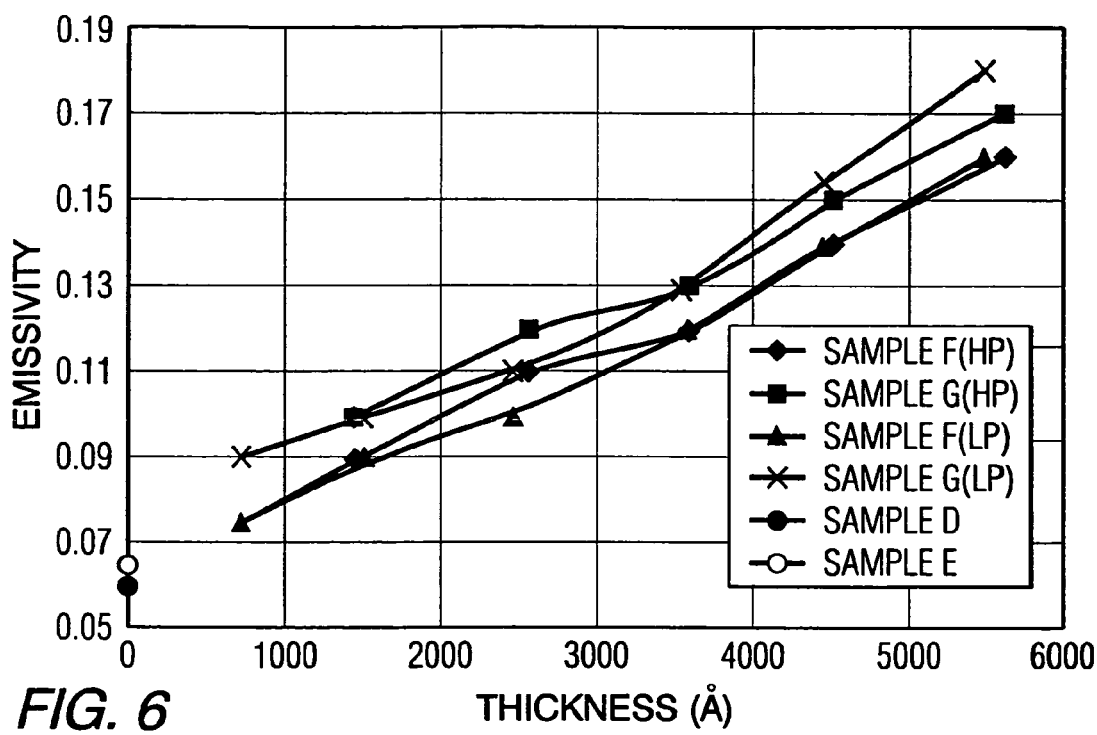
FIG. 6 is a graph of emissivity value versus coating thickness for substrates having a protective coating of the invention.

FIG. 6 shows the effect of a protective overcoat of the invention deposited at different MSVD process vacuum pressures over two different functional coatings. The Samples shown in FIG. 6 are 2 mm thick coupons of clear float glass with the following coatings deposited thereon:
Sample D—control sample; nominally 1600 Å thick blue reflecting functional coating having no protective coating.
Sample E—control sample; nominally 1600 Å thick green reflecting functional coating having no protective coating.
Sample F(HP)—the functional coating of Sample D plus an aluminum oxide protective coating sputter deposited as described above at an MSVD process vacuum pressure of 8 microns of oxygen and argon.
Sample F(LP)—the functional coating of Sample D plus an aluminum oxide protective coating sputter deposited as described above at an MSVD process vacuum pressure of 4 microns of oxygen and argon.
Sample G(HP)—the functional coating of Sample E plus an aluminum oxide protective coating sputter deposited as described above at an MSVD process vacuum pressure of 8 microns of oxygen and argon.
Sample G(LP)—the functional coating of Sample E plus an aluminum oxide protective coating sputter deposited as described above at an MSVD process vacuum pressure of 4 microns of oxygen and argon.

As shown in FIG. 6, as the thickness of the protective coating increases, the emissivity of coating stack also increases. At a protective coating thickness of about 1.5 microns, the coating stack had an emissivity of greater than about 0.5.

Figure 7:
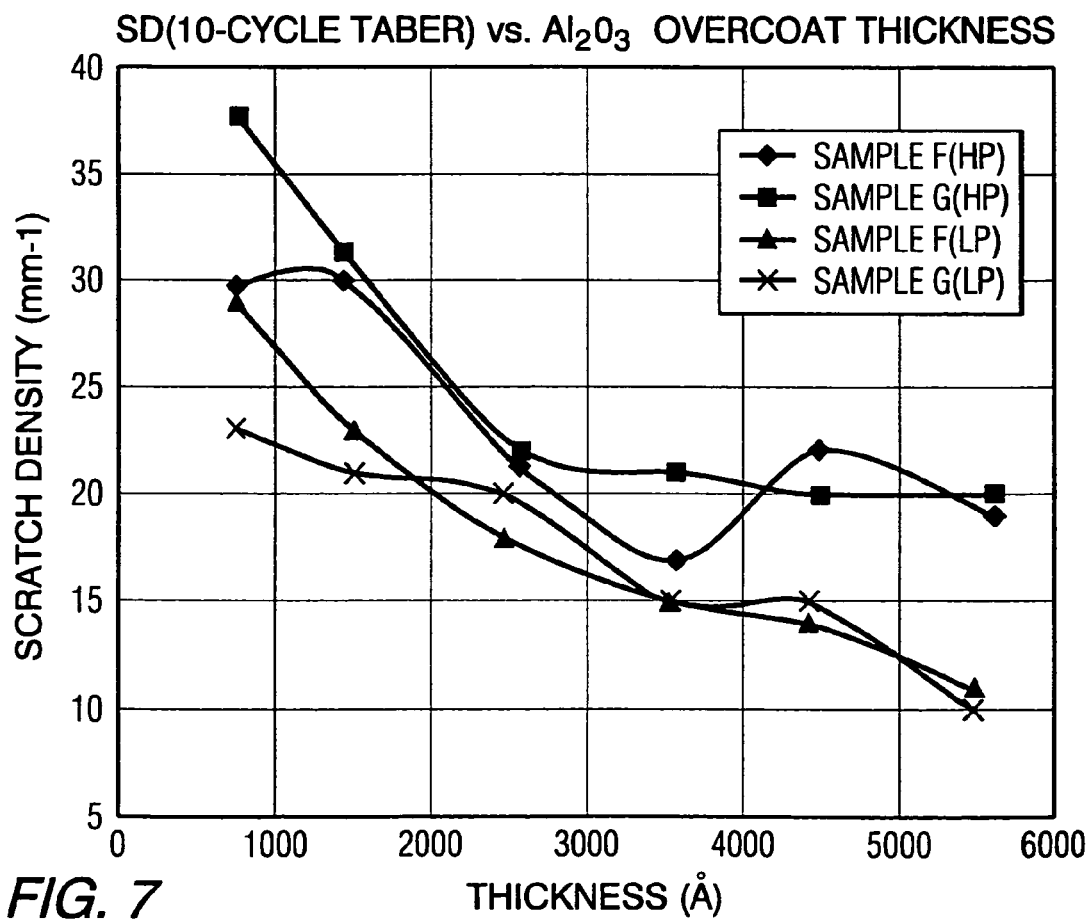
FIG. 7 is a graph showing Taber abrasion test results for substrates having a protective coating of the invention.

FIG. 7 shows the results of scratch density measurements after 10 cycles Taber abrasion for Samples F(HP), F(LP), G(HP), and G(LP) described above. The control functional Samples D and E with no protective coating had initial scratch densities on the order of about 45 $mm^{-1}$ to 50 $mm^{-1}$. As shown in FIG. 7, the application of a protective coating of the invention (even on the order of less than about 800 Å) improves the durability of the resultant coating stack.

Figure 8:
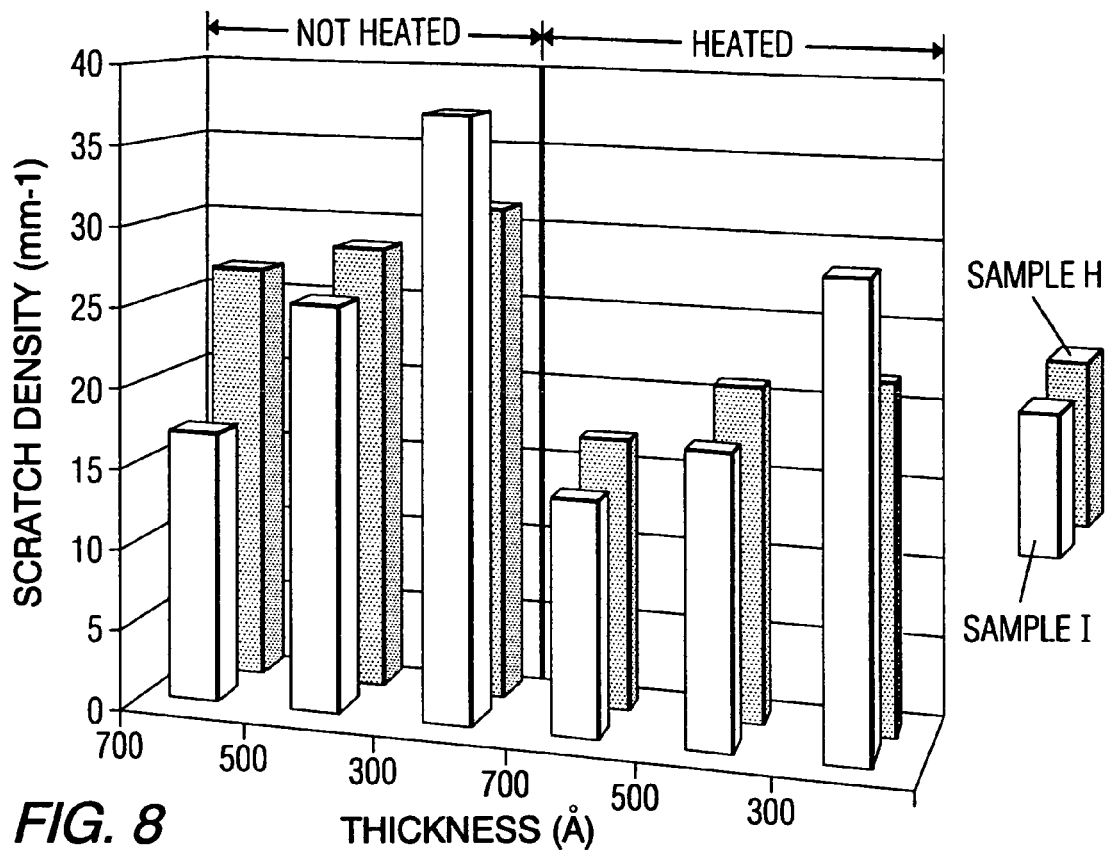
FIG. 8 is a bar graph showing the effects of heat treatment and coating thickness on Taber abrasion for coated substrates having a protective coating of the invention.

FIG. 8 shows the results of scratch density measurements after 10 cycles Taber abrasion for the following Samples of blue or green reflecting functional coatings with aluminum oxide protective coatings 300 Å, 500 Å, and 700 Å thick:
Sample H—the functional coating of Sample D plus an aluminum oxide protective coating sputter deposited as described above by MSVD.
Sample I—the functional coating of Sample E plus an aluminum oxide protective coating sputter deposited as described above by MSVD.

As shown on the right side of FIG. 8, heating the coating stack of the invention improves the durability of the coating stack. The coatings on the right side of FIG. 8 were heated by insertion in a 1300° F. oven for 3 mins, and then removed and placed in a 400° F. oven for 5 mins, after which the coated samples were removed and allowed to cool under ambient conditions.

EXAMPLE 2

This Example illustrates the effect of the protective coating of the invention on the visible light transmittance of a coated substrate upon heating.

Figure 9:
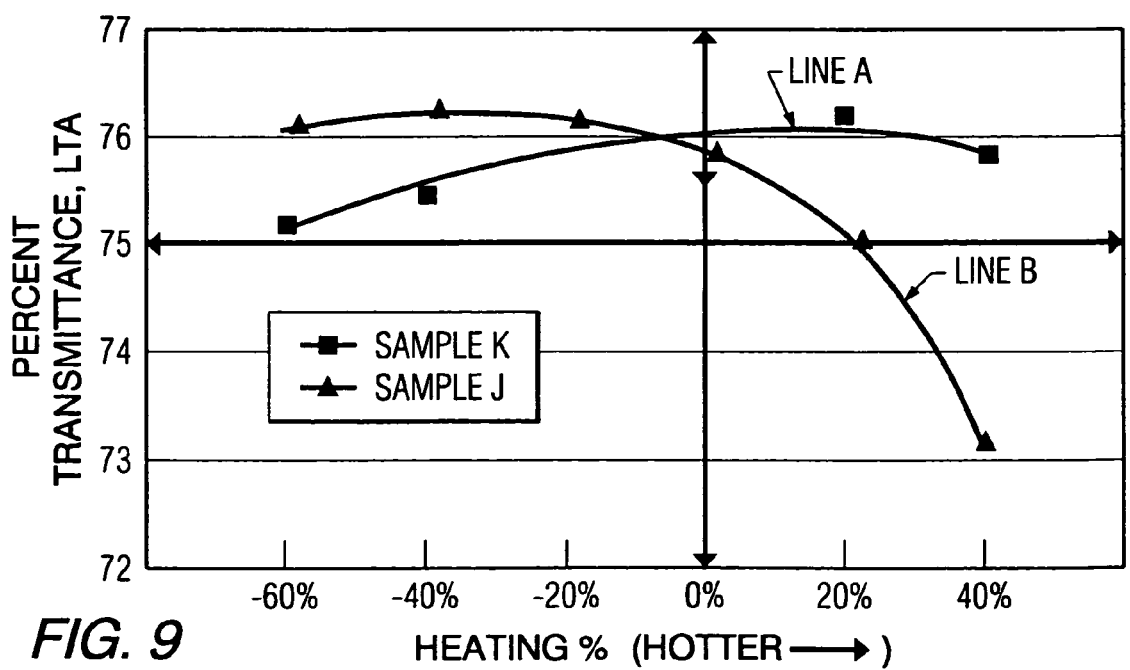
FIG. 9 is a graph showing the change in the transmittance of visible light (Lta) upon heating for a functionally coated substrate having a protective (barrier) coating of the invention (Line A) and for a functionally coated substrate without the protective (barrier) coating (Line B). The drop-off in slope of Line B indicates a decrease in performance of the non-protective coated substrate compared to the protective coated substrate under the same heating conditions.

A glass piece (Sample J) was prepared having a conventional infrared reflecting solar control coating without a protective coating of the invention and another glass piece (Sample K) was prepared having the same infrared reflecting solar control coating but with a protective coating of the invention. The protective coating in this example was a mixture of silica and alumina (70 wt. % alumina and 30 wt. % silica at a thickness of 600 Å to 700 Å). The two samples were heated in a conventional oven and the percent of visible light transmittance (Lta) of the two samples was measured at different heating percents. The "heating percent" values in FIG. 9 represent the thermal budget of the heated substrates based on a reference value (0%). By "thermal budget" is meant the highest temperature achieved and the overall time of heating. The higher the heating percent, the hotter the samples were heated. As will be seen from Line B in FIG. 9, as the non-protective coated Sample J is heated above the reference value, the visible light transmittance decreases and drops below 75 percent at a heating percent of about 20%. As will be appreciated by one skilled in the automotive art, visible light transmittance below about 75 percent is undesirable for most windshield application. However, as also seen in FIG. 9, the protective coated Sample K under the same heating conditions maintains visible light transmittance above 75 percent even at 40 heating percent (Line A). Thus, the protective coating of the invention permits a functionally coated substrate to be heated to higher temperatures and/or for longer periods of time without adversely impacting upon visible light transmittance. This feature would be advantageous for operations such as deep sag bending or similar operations in which prolonged heating is desired.

It will be readily appreciated by those skilled in the art that modifications may be made to the invention without departing from the concepts disclosed in the foregoing description. For example, although in the preferred embodiment of the laminated article only one ply includes a functional coating, it is to be understood that the invention could also be practiced with both plies having a functional coating or one ply having a functional coating and the other ply having a non-functional coating, e.g., a photocatalytic coating. Moreover, as will be appreciated by one of ordinary skill in the art, the preferred operating parameters described above can be adjusted, if required, for different substrate materials and/or thicknesses. Accordingly, the particular embodiments described in detail herein are illustrative only and are not limiting to the scope of the invention, which is to be given the full breadth of the appended claims and any and all equivalents thereof.

What is claimed is:

1. An article, comprising:
a substrate;
a functional coating deposited over at least a portion of the substrate; and
a barrier coating comprising a first layer formed over the functional coating and a second layer formed over the first layer, wherein the first layer comprises 50 wt. % to 99 wt. % alumina and 50 wt. % to 1 wt. % silica, and the second layer comprises 80 wt. to 95 wt. silica and 5 wt. to 20 wt. alumina,
wherein the barrier coating is stable to oxygen-containing gases and limits the transmission of oxygen-containing gases to materials over which it is deposited when subjected to conditioning comprising one or more of heating, bending, and tempering.

2. The article of claim 1, wherein the substrate is an oxygen barrier.

3. The article of claim 1, wherein the substrate includes at least one other barrier coating formed over at least a portion of the substrate and wherein the functional coating is formed over the at least one other barrier coating.

4. The article of claim 1, wherein the barrier coating has a refractive index in the range of 1.4 to 1.8.

5. The article of claim 1, wherein the substrate is selected from glass, plastic, and ceramic.

6. The article of claim 1, wherein the article is an automotive transparency.

7. The article of claim 1, wherein the article is selected from the group of comprising a window, a single pane of glass, a window with multiple panes of glass, an aircraft transparency, and a motor vehicle transparency.

8. The article of claim 1, wherein the substrate has a thickness in the range of 0.2 mm to 20 mm.

9. The article of claim 1, wherein the functional coating has an emissivity of 0.1 or less.

10. The article of claim 1, wherein the barrier coating increases the emissivity of the coating stack by at least a factor of two with respect to the emissivity of the functional coating.

11. The article of claim 1, wherein the barrier coating increases the emissivity of the coating stack by a factor in the range of 2 to 20 compared to the emissivity of the functional coating.

12. The article of claim 1, wherein the functional coating has an emissivity of less than or equal to 0.1 and the coating stack has an emissivity of greater than or equal to 0.5.

13. The article of claim 1, wherein the emissivity of the coating stack is 0.5 to 0.8.

14. The article of claim 1, wherein the first layer comprises 70 wt. % to 99 wt. % alumina and 30 wt. % to 1 wt. % silica.

15. The article of claim 1, wherein the first layer comprises 50 wt. % to 60 wt. % alumina and 40 wt. % to 50 wt. % silica.

16. The article of claim 1, wherein the first layer comprises 55 wt. % alumina and 45 wt. % silica.

17. The article of claim 1, wherein the first layer has a thickness in the range of 50 Å to 1,000 Å.

18. The article of claim 1, wherein the first layer has a thickness in the range of 50 Å to 200 Å.

19. The article of claim 1, wherein the first layer has a thickness of 125 Å.

20. The article of claim 15, wherein the first layer has a thickness in the range of 50 Å to 400 Å.

21. The article of claim 16, wherein the first layer has a thickness of 200 Å.

22. The article of claim 1, wherein the second layer has a thickness in the range of 50 Å to 2,000 Å.

23. The article of claim 1, wherein the second layer has a thickness in the range of 300 Å to 1,000 Å.

24. The article of claim 1, wherein the second layer has a thickness of 500 Å.

25. The article of claim 1, wherein the barrier coating provides an oxygen permeability of less than or equal to 1.5 cubic cm of oxygen gas at a thickness of one mil for 100 square inches over a period of twenty-four hours under an oxygen partial pressure differential of one atmosphere at 23° C. and a relative humidity of zero.

26. The article of claim 1, wherein the barrier coating is solar absorbing in at least one of the UV, IR, or visible regions of the electromagnetic spectrum.

27. The article of claim 1, wherein the article is a monolithic transparency.

* * * * *